(12) United States Patent
Studer et al.

(10) Patent No.: US 10,745,242 B2
(45) Date of Patent: Aug. 18, 2020

(54) METHOD FOR ANALYSIS AND MEASUREMENT SYSTEM FOR MEASURING AN ELEVATOR SHAFT OF AN ELEVATOR SYSTEM

(71) Applicant: Inventio AG, Hergiswil (CH)

(72) Inventors: Christian Studer, Kriens (CH); Raphael Bitzi, Lucerne (CH); Erich Butler, Ebikon (CH)

(73) Assignee: INVENTIO AG, Hergiswil NW (CH)

( * ) Notice: Subject to any disclaimer, the term of this patent is extended or adjusted under 35 U.S.C. 154(b) by 0 days.

(21) Appl. No.: 16/323,800

(22) PCT Filed: Aug. 29, 2017

(86) PCT No.: PCT/EP2017/071629
§ 371 (c)(1),
(2) Date: Feb. 7, 2019

(87) PCT Pub. No.: WO2018/041815
PCT Pub. Date: Mar. 8, 2018

(65) Prior Publication Data
US 2019/0177120 A1    Jun. 13, 2019

(30) Foreign Application Priority Data
Aug. 30, 2016    (EP) .................................... 16186223

(51) Int. Cl.
*G01N 21/00*    (2006.01)
*B66B 3/02*    (2006.01)
(Continued)

(52) U.S. Cl.
CPC ................ *B66B 3/02* (2013.01); *B66B 19/00* (2013.01); *G01B 11/022* (2013.01);
(Continued)

(58) Field of Classification Search
CPC .. B66B 3/02; B66B 19/00; B66B 1/30; B66B 5/0018; G06F 30/13; H04N 13/243;
(Continued)

(56) References Cited

U.S. PATENT DOCUMENTS 6,349,249 B1   2/2002   Cunningham
7,562,747 B2   7/2009   Marchesi
(Continued)

FOREIGN PATENT DOCUMENTS

WO    2014027142 A1    2/2014
WO    2017093438 A1    6/2017

*Primary Examiner* — Abdullahi Nur
(74) *Attorney, Agent, or Firm* — William J. Clemens; Shumaker, Loop & Kendrick, LLP

(57) ABSTRACT

An analysis method and a measurement system for surveying an elevator shaft of an elevator system wherein the elevator shaft is surveyed by a measurement system having a camera system and an inertial measurement unit having acceleration and angular rate sensors, i.e. designed as an optically inertial measurement system. On the basis of the measured data, a digital model of the elevator shaft is created. Further information on the position of the measurement system in a main extension direction of the elevator shaft, in addition to the information from the acceleration and angular rate sensors of the inertial measurement unit, is recorded and evaluated to create the digital model. In this way, a particularly accurate digital model of the elevator shaft is created.

14 Claims, 2 Drawing Sheets

10 MEASUREMENT SYSTEM
12 WINCH
22, 23a, 23b CAMERA
23 BODY
24 EVALUATION UNIT
25 INERTIAL MEASUREMENT UNIT
28 READING UNIT
29a-c MARKINGS

(51) Int. Cl.
| | |
|---|---|
| *B66B 19/00* | (2006.01) |
| *G06F 30/13* | (2020.01) |
| *H04N 13/243* | (2018.01) |
| *G01B 11/02* | (2006.01) |
| *G01B 11/04* | (2006.01) |
| *H04N 5/247* | (2006.01) |

(52) U.S. Cl.
CPC ............ *G01B 11/043* (2013.01); *G06F 30/13* (2020.01); *H04N 5/247* (2013.01); *H04N 13/243* (2018.05)

(58) Field of Classification Search
CPC .... H04N 5/247; G01B 11/022; G01B 11/043; G01C 3/08
See application file for complete search history.

(56) References Cited

U.S. PATENT DOCUMENTS

| | | |
|---|---|---|
| 2013/0096873 A1 | 4/2013 | Rosengaus et al. |
| 2014/0251734 A1* | 9/2014 | Wang ................ B66B 7/043 187/247 |
| 2016/0139269 A1 | 5/2016 | Yamazaki et al. |

\* cited by examiner 222a-d CAMERA
224 EVALUATION UNIT
225 INERTIAL MEASUREMENT UNIT

METHOD FOR ANALYSIS AND MEASUREMENT SYSTEM FOR MEASURING AN ELEVATOR SHAFT OF AN ELEVATOR SYSTEM

FIELD

The invention relates to a method for analyzing an elevator shaft of an elevator system, which shaft extends mainly in a main extension direction, and to a measurement system for surveying an elevator shaft of an elevator system, which shaft extends mainly in a main extension direction.

BACKGROUND

WO 2014/027142 A2 describes a method for analyzing an elevator shaft of an elevator system, in which the elevator shaft is surveyed using a measurement system. The measurement system has a scanning device, for example in the form of a camera system having one or more cameras. By means of the scanning device, distances to and/or relative positions with respect to elements of the elevator shaft, such as shaft walls, are established. The position of the scanning device in the elevator shaft is determined, for example, by means of an acceleration sensor. On the basis of the position of the scanning device and the established distances and/or relative positions, a digital model of the elevator shaft is created. Subsequently, a check is carried out on the basis of the digital model as to whether the elevator shaft and any elevator system parts already fitted in the elevator shaft are designed as intended.

SUMMARY

Against this background, an object of the invention is in particular to propose an analysis method and a measurement system for surveying an elevator shaft of an elevator system that allow the elevator shaft to be surveyed particularly accurately.

In the method according to the invention for analyzing an elevator shaft of an elevator system, which shaft extends mainly in a main extension direction, the elevator shaft is surveyed by means of a measurement system having a camera system. On the basis of data established during the survey, a digital model of the elevator shaft is created. According to the invention, the survey is carried out by means of a measurement system that, in addition to said camera system, also comprises an inertial measurement unit having acceleration and angular rate sensors. The measurement system is thus designed as an "optically inertial measurement system". By means of the inertial measurement unit, a position of the optically inertial measurement system in the elevator shaft can be estimated. To create the digital model of the elevator shaft, at least one further piece of information on the position of the optically inertial measurement system in the main extension direction is recorded and evaluated in addition to the information from the acceleration and angular rate sensors of the inertial measurement unit. In this case, information from the acceleration and angular rate sensors should be understood to mean in particular variables such as accelerations and angular rates measured by the sensors, as well as variables derived from the measured variables.

Said digital model of the elevator shaft is created on the basis of the position of the measurement system and the location or relative position of distinctive points, such as corners or protrusions on a shaft wall, in relation to the measurement system. The location of the distinctive points, i.e. in particular the distances from the measurement system in three coordinate directions, each arranged perpendicularly to one another, can be determined very precisely and reliably by the measurement system. To create a correct digital model, however, knowledge of the position of the measurement system is very important. Any error in determining the position of the measurement system leads to a corresponding error in the digital model. Conventionally, inertial measurement units comprise three acceleration sensors arranged perpendicularly to one another and three angular rate sensors arranged perpendicularly to one another, by means of which the accelerations in the x, y and z-directions and the angular accelerations about the x, y and z axes can be determined and the current position of the inertial measurement unit can be established or at least estimated therefrom based on a starting position. In addition, the inertial measurement unit can also have three magnetic field sensors arranged perpendicularly to one another. In this case, the determination of the acceleration in the vertical direction, i.e. z-direction, is strongly influenced by gravitational acceleration, which can lead to errors when determining or estimating the position of the measurement unit in the z-direction. As described, this error in the z-position of the measurement system then also leads to an error in the digital model of the elevator shaft, meaning that a digital model established on the basis of incorrect information on the position of the measurement system does not accurately represent the elevator shaft.

Due to at least one piece of further information on the position of the optically inertial measurement system in the main extension direction of the elevator shaft being recorded and evaluated according to the invention, the position of the measurement system can be determined particularly accurately. On the basis of the very precise determination of the position of the measurement system, therefore, a very accurate digital model of the elevator shaft can be created.

The aforementioned further information on the position of the optically inertial measurement system in the main extension direction can vary and be recorded and evaluated in very different manners. For example, the position of the measurement system in the main extension direction can be re-measured, in addition to the estimation of the position of the measurement system in the main extension direction by means of the inertial measurement unit. For this purpose, there are various methods and systems available, for example those provided for the normal operation of elevator systems. In addition or alternatively, indirect information on the position of the measurement system in the main extension direction can also be recorded and evaluated. For this purpose, the relative position of the measurement system in relation to one or more reference elements recorded by the camera system can be determined and evaluated. A prerequisite for this is that information on absolute or relative positions of the reference element(s) is available. From this information and from the location of the measurement system with respect to the reference element(s), the position of the measurement system in the main extension direction can be deduced, or the position thereof determined. The position of the measurement system in the main extension direction determined by means of the aforementioned further information on the position of the optically inertial measurement system can be used to survey the elevator shaft instead of the position determined by means of the inertial measurement unit, for example. However, it is also possible for one position for the survey to be determined from both the aforementioned positions. For example, an average of these positions can be used. It is also possible to use the aforementioned further information on the position of the optically inertial measurement system in the main extension direction to adjust and/or calibrate the inertial measurement unit in the main extension direction.

The measurement system camera system used for surveying the elevator shaft can be designed as a single camera, a plurality of cameras, two cameras combined to form a stereo camera, or a plurality of stereo cameras. In this case, the cameras are designed as digital cameras. In particular, clock rates of the cameras and of the inertial measurement unit are synchronized or coordinated with one another. In the process, the location of a distinctive point in relation to the measurement system is determined by means of triangulation. In this case, the distinctive point is recorded from two different camera positions and its location determined. On the basis of the distance of the two different camera positions from one another and the relative positions of the distinctive point in relation to each camera position, the location of the distinctive point in relation to the measurement system can be determined in a known manner. When using a camera, the camera must be moved such that it can record the distinctive point from at least two different camera positions to allow the aforementioned triangulation to be executed. In stereo cameras, two cameras are arranged at a defined distance from one another such that a distinctive point can be recorded simultaneously by both cameras at different camera positions and the triangulation executed.

To survey the elevator shaft, the measurement system is moved in particular within the elevator shaft to thus be able to survey the entire elevator shaft. The movement takes place in particular in the main extension direction and by means of a displacement device, for example in the form of a winch. The measurement system is suspended for example by means of a support means, in particular in the form of a rope or chain, by means of which the displacement device, arranged in particular in a shaft head of the elevator shaft, can move the measurement system in the main extension direction, i.e. in particular can wind the system up and let it down in the vertical direction. A special guide for the measurement system, e.g. a device for preventing rotation about an axis in parallel with the main extension direction or for preventing displacement transversely to the main extension direction, is not absolutely necessary but can be provided. In a simple embodiment of such a guide, the measurement system can, for example, by suspended by two support means extending in parallel; this would prevent rotation and displacement of the measurement system.

In this context, an analysis of an elevator shaft should be understood in particular as being the survey of the elevator shaft and optionally a subsequent check and evaluation of the data obtained during the survey. In the process, the result of the survey is a digital model of the elevator shaft. The digital model includes in particular information on the position of distinctive points, such as corners or protrusions in a shaft wall; these may be in the form of a "point cloud." Each individual point of this point cloud is a surveyed distinctive point. Though not necessary, said point cloud can be reworked using suitable methods, and, for example, information on the dimensions of the elevator shaft and on positions of door cut-outs can be derived.

In this context, the main extension direction of an elevator shaft should be understood to be the direction in which an elevator car of the completed elevator system is moved. The main extension direction thus extends in particular vertically, but it may also be tilted relative to the vertical or extend horizontally.

In an embodiment of the invention, the optically inertial measurement system comprises three stereo cameras, i.e. at least six individual cameras which, during the survey of the elevator shaft, are arranged transversely to the main direction such that an all-round view is ensured. The all-round view thus relates to an axis in parallel with the main extension direction of the elevator shaft. In this way, it is advantageously possible for the measurement system to record a complete portion in the main extension direction of the elevator shaft from one position. This allows the elevator shaft to be surveyed particularly quickly and in particular also accurately. In this context, an all-round view should be understood to mean that the measurement system can record and evaluate objects in all directions transversely to the main extension direction, i.e. in particular in the horizontal direction, without having to move itself. In square elevator shafts, the measurement system can thus record all four shaft walls defining the elevator shaft all at once. The all-round view is made possible by using at least three stereo cameras oriented such that their individual recording regions cover an angular range of 360° about the main extension direction. In this case, the individual recording ranges of the stereo cameras in particular overlap. When using three stereo cameras, they can be arranged, for example, perpendicularly to sides of an equilateral triangle. When using four stereo cameras, they can be arranged, for example, perpendicularly to sides of a square. Other arrangements that allow for an all-round view are also conceivable.

Alternatively to arranging the cameras transversely to the main extension direction, one or more cameras can also be arranged in the main extension direction. The cameras can thus face upward or downward in the elevator shaft, for example.

In an embodiment of the invention, the optically inertial measurement system is coupled to a position determination unit, which determines a position of the measurement system in the main extension direction. This position is recorded and evaluated as further information on the position of the optically inertial measurement system in the main extension direction. Position determination units can determine a position very accurately and in particular without any influence from gravitational acceleration. Position determination units of this kind, which are designed, for example, as ultrasound or laser measurement units or evaluate a positional information carrier oriented in the main extension direction, for example in the form of a code strip having magnetic or optical code marks, are available on the market in large quantities and at relatively low prices. The elevator shaft can thus be surveyed cost-effectively and very accurately.

In this context, coupling the measurement system to a position determination unit should be understood to mean a local coupling and/or signal-based coupling. The position determination unit can thus be arranged on the measurement system, for example. However, it is also possible for at least parts of the position determination unit to be spatially separate from the measurement system, e.g. in the elevator shaft, in particular arranged on the displacement device, and to be connected to the measurement system solely by signals. The position determination unit can transmit unconditioned signals to the measurement system, which are evaluated by the measurement system. It is also possible for the position determination unit to comprise an evaluation electronics system that delivers a prepared signal to the measurement system. A relative position of the measurement system in the main extension direction can also be measured. For this purpose, the displacement of a support means holding the measurement system can be determined, for example, and the current position of the measurement system thus determined based on a starting position.

In an embodiment of the invention, the position determination unit determines a piece of information on the position of the measurement system in the main extension direction by means of an elongate positional information carrier oriented in the main extension direction. In the process, the stereo cameras and the positional information carrier are arranged relative to one another such that the positional information carrier is not recorded by any of the stereo cameras. If a stereo camera were to record the positional information carrier, this would need to be recognized and any distinctive points recorded on the positional information carrier removed at a later time. This is complex and can lead to errors when creating the digital model of the elevator shaft. This embodiment of the invention thus allows for a simple elevator shaft surveying method that is particularly unsusceptible to errors.

If the stereo cameras are arranged on the sides of a triangle or square, as described above, the positional information carrier is implemented within the area of the triangle or square. In other words, the positional information carrier extends in particular behind or at the rear of each stereo camera. In particular, together with a support means on which the measurement system is suspended and from which the positional information carrier is offset, said carrier can also be used as a guide for preventing unwanted rotation and/or displacement of the measurement system.

The positional information carrier is designed in particular as a code strip that has magnetic or optical code marks and is stretched out in the main extension direction in the elevator shaft. In this case, the position determination unit comprises a reading unit which reads out and evaluates information in the form of the code marks. In particular, the reading unit is arranged on the measurement system, and particularly such that it cannot be recorded by any stereo camera either. In other words, said unit is arranged in particular behind or at the rear of each stereo camera.

In an embodiment of the invention, at least one reference element is arranged in the elevator shaft prior to the survey by means of the optical inertial measurement system. Said reference element is recorded during the survey by the optical inertial measurement system and the recorded information on the reference element is evaluated as further information on the position of the optically inertial measurement system in the main extension direction in order to create the digital model of the elevator shaft. This allows the elevator shaft to be surveyed very accurately.

In particular, not just one, but rather a plurality of reference elements are arranged in the elevator shaft. As a reference element, it is possible to use, for example, a marking that a camera of the measurement system can simply and clearly record and evaluate as a distinctive point. The measurement system then determines its location with respect to the reference element(s) and deduces therefrom its position in the main extension direction in the elevator shaft.

In particular, one reference element is arranged at a known position in the main extension direction in the elevator shaft and this known position is evaluated in order to create the digital model of the elevator shaft. For example, a reference element can be arranged at a defined distance from, for example, a shaft ceiling or a shaft floor. While surveying the elevator shaft, the measurement system then recognizes the reference element and knows the position thereof, meaning that the system can derive its position in the main extension direction from the position of the reference element and its location relative to said element. Instead of a reference element at a known position with respect to a shaft ceiling or shaft floor, a reference element can also be arranged at a known absolute height above sea level. Before beginning the interior work on a building and thus also before installing an elevator system, a building is typically surveyed by a surveyor and provided with markings. In the process, what is known as the meter level is applied, which indicates a reference height for installations that must be installed at a height corresponding to planning specifications. Examples of these are sanitary facilities such as wall-mounted toilets, faucets and drains, but also door frames or the position of a shaft door of an elevator system. The meter level is in particular a marking arranged at precisely 1 meter above the eventual upper level of the finished floor. In addition to this relative position, information on the height of the meter level above sea level can also be provided and processed.

Furthermore, at least two reference elements can be arranged at a known distance from one another in the main extension direction in the elevator shaft. This known distance is then evaluated in order to create the digital model of the elevator shaft. The two reference elements can be recorded by the measurement system. On the basis of the measured data, the measurement system then estimates the distance between the two reference elements and compares this with the known distance between the reference elements. From this comparison, the exact position of the measurement system in the main extension direction can be deduced. This approach can be used particularly advantageously if, before the survey, a cord having reference elements, for example in the form of markings, at defined distances of e.g. one meter from one another is stretched out in the main extension direction in the elevator shaft. The cord can in particular also be arranged such that the markings are at a known distance from the shaft floor or shaft ceiling. For example, the cord can be arranged such that the lowermost marking is at a distance of one meter from the shaft floor. As a result, both the position of the markings with respect to the shaft floor or shaft ceiling and also the distance between the markings are known. However, it is also possible to arrange more than two reference elements in the elevator shaft at a defined distance from one another in the main extension direction in a different manner.

In an embodiment of the invention, prior to the survey by the optical inertial measurement system, an elongate orientation element extending mainly in the main extension direction is arranged in the elevator shaft and is used to verify the established position of the optically inertial measurement system. This ensures the elevator shaft is surveyed particularly accurately.

In the process, the orientation element is used in particular to verify the position of the measurement system transversely to the main extension direction of the elevator shaft. In addition to the aforementioned inaccuracies when determining the position of the measurement system by means of the inertial measurement unit in the vertical direction, i.e. z-direction, there may also be more minor inaccuracies in the x and/or y-direction. By arranging and evaluating said orientation element, these inaccuracies can be recognized and eliminated. The established position of the optically inertial measurement system can be verified as mentioned above either during the survey or later when creating the digital model of the elevator shaft.

Said orientation element can in particular comprise a plurality of reference elements arranged at a defined distance from one another. For example, the orientation element can be designed as a cord on which each reference element in the form of a marking is arranged so as to be spaced apart by, for example, one meter. In this way, the orientation element can advantageously fulfil two functions. Firstly, it can ensure that the position of the measurement system in the main extension direction is determined accurately, and secondly, it can ensure that the position of the measurement system transversely to the main extension direction is verified. In particular, the orientation element can be arranged such that the markings are at a known distance from the shaft floor or shaft ceiling.

In an embodiment of the invention, after the digital model of the elevator shaft has been created, said model is compared with a target model of the elevator shaft. It can thus advantageously be checked whether the actual elevator shaft meets the specifications. If there are excessively large discrepancies, reworking may be required for example, and/or the elevator shaft may be denied approval.

In an embodiment of the invention, after the digital model of the elevator shaft has been created, a check is carried out as to whether a planned design of the elevator system can be implemented in the surveyed elevator shaft. As a result, the assembly of the elevator system can only begin when it is certain that the assembly can also be completed as planned. This can prevent unnecessary costs. The planned design of the elevator system should be understood to mean, by way of example, a size of the elevator car and a counterbalance, an arrangement of guide rails and of the retainers for the elevator car and the counterbalance, and the arrangement of additional elevator system elements.

In an embodiment of the invention, if the planned design of the elevator system cannot be implemented in the surveyed elevator shaft, adjustments are made to the elevator shaft and/or to the design of the elevator system. This can prevent adjustments and thus high costs and lost time, as would occur after the elevator system has begun to be built. More cost-effective and quicker construction of the elevator system is thus made possible. In this context, adjustments should be understood to mean that the walls of the elevator shaft are altered, the size of the elevator car and/or the counterbalance is adjusted, other retainers for guide rails are provided, or planned positions of said retainers are changed.

The aforementioned object of the invention is also achieved by a measurement system for surveying an elevator shaft of an elevator system, which shaft extends mainly in a main extension direction, by means of a camera system, which additionally comprises an inertial measurement unit having acceleration and angular rate sensors, and an evaluation unit. By means of the inertial measurement unit, a position of the measurement system in the elevator shaft can be estimated. The evaluation unit is provided to record and evaluate further information on the position of the measurement system in the main extension direction, in addition to the information from the acceleration and angular rate sensors of the inertial measurement unit, in order to create a digital model of the elevator shaft.

In particular, the measurement system according to the invention allows an elevator shaft to be measured particularly accurately. In terms of possible embodiments and further advantages, reference is made to the above explanations in terms of the method using a measurement system of this kind.

In an embodiment of the invention, the measurement system comprises three stereo cameras which, during the survey of the elevator shaft, are arranged transversely to the main direction such that an all-round view is ensured in relation to the main extension direction. In this case, the stereo cameras can be arranged transversely, i.e. at a 90° angle, to the main extension direction, but also slightly tilted, in particular downward. The measurement system also comprises a reading unit of a position determination unit for reading out information from a positional information carrier, by means of which unit a position of the measurement system in the main extension direction can be determined. This ensures an elevator shaft can be surveyed particularly quickly.

In an embodiment of the invention, the reading unit of the position determination unit and the stereo cameras are arranged relative to one another such that the reading unit cannot be recorded by any of the stereo cameras. In other words, said unit is arranged in particular behind or at the rear of each stereo camera. If a stereo camera were to record the reading unit, this would need to be recognized and any distinctive points recorded on the reading unit removed at a later time. This is complex and can lead to errors when creating the digital model of the elevator shaft. This embodiment of the invention thus allows an elevator shaft to be surveyed simply and in a manner that is particularly unsusceptible to errors.

Further advantages, features and details of the invention can be found in the following description of embodiments and with reference to the drawings, in which like elements or those having the same function are provided with identical reference signs.

DETAILED DESCRIPTION

Figure 1:
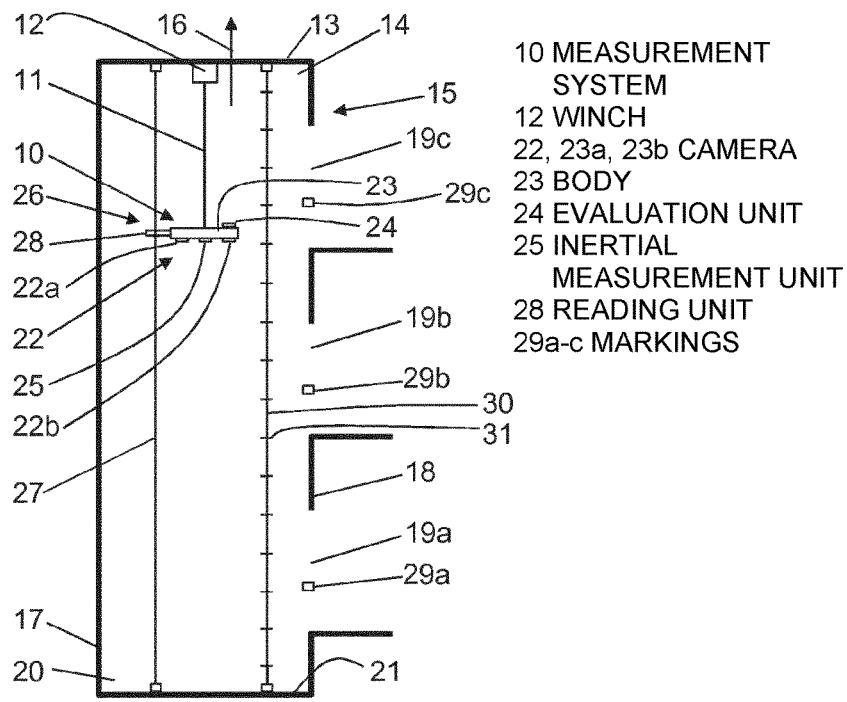
FIG. 1 is a side view of a measurement system during the survey of an elevator shaft.

According to FIG. 1, an optically inertial measurement system 10 is suspended on a shaft ceiling 13 of a shaft head 14 of a mainly square elevator shaft 15 by means of a support means in the form of a rope 11 and by means of a displacement device in the form of a winch 12. The elevator shaft 15 extends in a vertically oriented main extension direction 16 and has a total of four shaft walls, although the side view in FIG. 1 only shows one rear shaft wall 17 and one front shaft wall 18. The front shaft wall 18 comprises a total of three door openings 19a, 19b, 19c, which are arranged one above the other in the main extension direction 16. At a later point in time, shaft doors allowing the elevator shaft 15 to be closed and an elevator car to be accessed will be installed in the shaft openings 19a, 19b, 19c. Opposite the shaft head 14, the elevator shaft 15 has a shaft pit 20, which is closed by a shaft floor 21.

The measurement system 10 comprises a camera system in the form of a digital stereo camera 22 having a first camera 22a and a second camera 22b. The stereo camera 22 is arranged on a mainly square main body 23 of the measurement system 10 in such a way that it is oriented vertically downward toward the shaft floor 20 when in the suspended state shown. The stereo camera 22 is designed such as to be able to record portions of all four shaft walls when in the shown state. The stereo camera 22 is connected by signals to an evaluation unit 24 of the measurement system 10, which receives and evaluates the images recorded by the stereo camera 22. The evaluation unit 24 searches the images for distinctive points, for example corners or protrusions in any of the shaft walls. As soon as it has identified a distinctive point in the two images of the cameras 22a, 22b, using the known distance between the two cameras 22a, 22b and the different locations of the distinctive point in the two images, said unit can use triangulation to determine the location of the distinctive point in relation to the camera 22a, 22b and thus in relation to the measurement system 10.

Between the two cameras 22a, 22b, an inertial measurement unit 25 is arranged on the main body 23 of the measurement system 10. The inertial measurement unit 25 comprises three acceleration sensors (not shown) arranged perpendicularly to one another and three angular rate sensors (not shown) arranged perpendicularly to one another, by means of which the accelerations in the x, y and z-directions and the angular accelerations about the x, y and z axes can be determined. From the measured accelerations, the inertial measurement unit 25 can estimate its position based on a starting position, and thus also that of the measurement system 10, and can transmit these to the evaluation unit 24 of the measurement system 10. It is also possible for the inertial measurement unit 25 to only transmit the measured accelerations to the evaluation unit 24 and for the evaluation unit 24 to estimate the position of the measurement system 10 therefrom.

To determine the position of the measurement system 10 in the main extension direction 16 in the elevator shaft 15 more accurately, the measurement system 10 is coupled to a position determination unit 26. The position determination unit 26 has a positional information carrier, which is oriented in the main extension direction 16 and is in the form of a code strip 27 stretched between the shaft floor 21 and shaft ceiling 13. The code strip 27 comprises invisible magnetic code marks, which represent information on the position in the main extension direction 16. The position determination unit 26 further comprises a reading unit 28 that is arranged on the side of the main body 23 of the measurement system 10 and through which the code strip 27 is guided. The code strip 27 thus counteracts rotation of the measurement system 10 about an axis in the main extension direction 16 and displacement of the measurement system 10 transversely to the main extension direction 16, and thus acts as a guide for the measurement system 10. The reading unit 28 reads out information in the form of the magnetic code marks of the code strip 27 and can thus very accurately determine the position of the reading unit 28 and thus of the measurement system 10 in the main extension direction 16. The information read out from the code strip 27 can thus be considered further information on the position of the measurement system 10 in the main extension direction 16 in addition to the information from the acceleration and angular rate sensors of the inertial measurement unit 25.

The position of the measurement system 10 in the main extension direction 16 determined by means of the position determination unit 26 is considered the correct position of the measurement system 10 and thus replaces the position of the measurement unit 10 in the main extension direction estimated by means of the inertial measurement unit 25. However, it is also possible for an average of the two aforementioned positions to be taken as the correct position.

From the position of the measurement system 10 determined as described above, and the location of a distinctive point relative to the measurement system 10, as determined by means of triangulation, the evaluation unit 24 determines the absolute position of the distinctive point. The evaluation unit 24 thus determines the positions of a plurality of distinctive points and in this way creates a digital model of the elevator shaft 15, which model initially consists of a plurality of individual points, i.e. what is known as a point cloud. At a later point in time when the data are processed further (a process not usually carried out by the evaluation unit 24), lines and areas can be derived from the point cloud. To survey the entire elevator shaft 15, the measurement system 10 is displaced downward in the elevator shaft 15 by the winch 12.

When reworking the digital model of the elevator shaft 15, said model is compared with a target model of the elevator shaft 15. It is thus checked whether the actual elevator shaft 15 meets the specifications. If there are excessively large discrepancies, reworking is required and/or the elevator shaft 15 may be denied approval. A check is also carried out as to whether a planned construction of the elevator system can be implemented in the surveyed elevator shaft 15. It is thus checked whether the individual components of the elevator system, such as the elevator car, counterbalance and guide rails, can be installed as planned. If this is not the case, adjustments are made to the elevator shaft 15 and/or to the design of the elevator system. For example, the shaft walls of the elevator shaft 15 may be altered, the size of the elevator car and/or the counterbalance adjusted, other retainers for guide rails provided, or planned positions of said retainers changed.

Instead of or in addition to using the position determination unit 26, additional information and tools can be used to survey the elevator shaft 15. Tools of this kind are also shown in FIG. 1. In the region of each shaft opening 19a, 19b, 19c, one reference element in the form of a marking 29a, 29b, 29c is arranged on a shaft wall. The markings 29a, 29b, 29c are in particular designed as what are known as meter levels, which are spaced apart by one meter from the eventual floor covering. In relation to each marking 29a, 29b, 29c, the absolute height above sea level or the relative height above the shaft floor 21 is known. As a result, the positions of the markings 29a, 29b, 29c in the main extension direction 16 within the elevator shaft 15 are known. The evaluation unit 24 can determine the location of a marking 29a, 29b, 29c with respect to the measurement system 10 as described above, and can deduce the actual position of the measurement system 10 in the main extension direction 16 on the basis of the known position of the marking 29a, 29b, 29c in the main extension direction and the aforementioned location. This actual position of the measurement system 10 thus determined is then used for surveying the elevator shaft 15. The position of one of more of the markings 29a, 29b, 29c can thus be considered further information on the position of the measurement system 10 in the main extension direction 16 in addition to the information from the acceleration and angular rate sensors of the inertial measurement unit 25.

Additionally or in addition to the markings 29a, 29b, 29c, an elongate orientation element in the form of a rope 30 can be stretched between the shaft floor 21 and the shaft ceiling 13. The rope 30 extends in particular in the main extension direction 16, i.e. in the vertical direction in this case. Said rope comprises reference elements in the form of distance markings 31 at a defined distance of e.g. one meter. The evaluation unit 24 can determine the positions of the distance markings 31 in the main extension direction 16 as described above, and can thus calculate the distance between each one. By comparing the calculated distances with the known actual distances, the evaluation unit 24 can verify and, where necessary, correct the used position of the measurement system 10 in the main extension direction 16. The distance between the distance markings 31 established by the evaluation unit 24 can thus be considered further information on the position of the measurement system 10 in the main extension direction 16 in addition to the information from the acceleration and angular rate sensors of the inertial measurement unit 25.

The rope 30 can also be used to verify the position of the measurement system 10 transversely to the main extension direction 16. The established position of the optically inertial measurement system can be verified as mentioned above either during the survey or later when creating the digital model of the elevator shaft.

Figure 2:
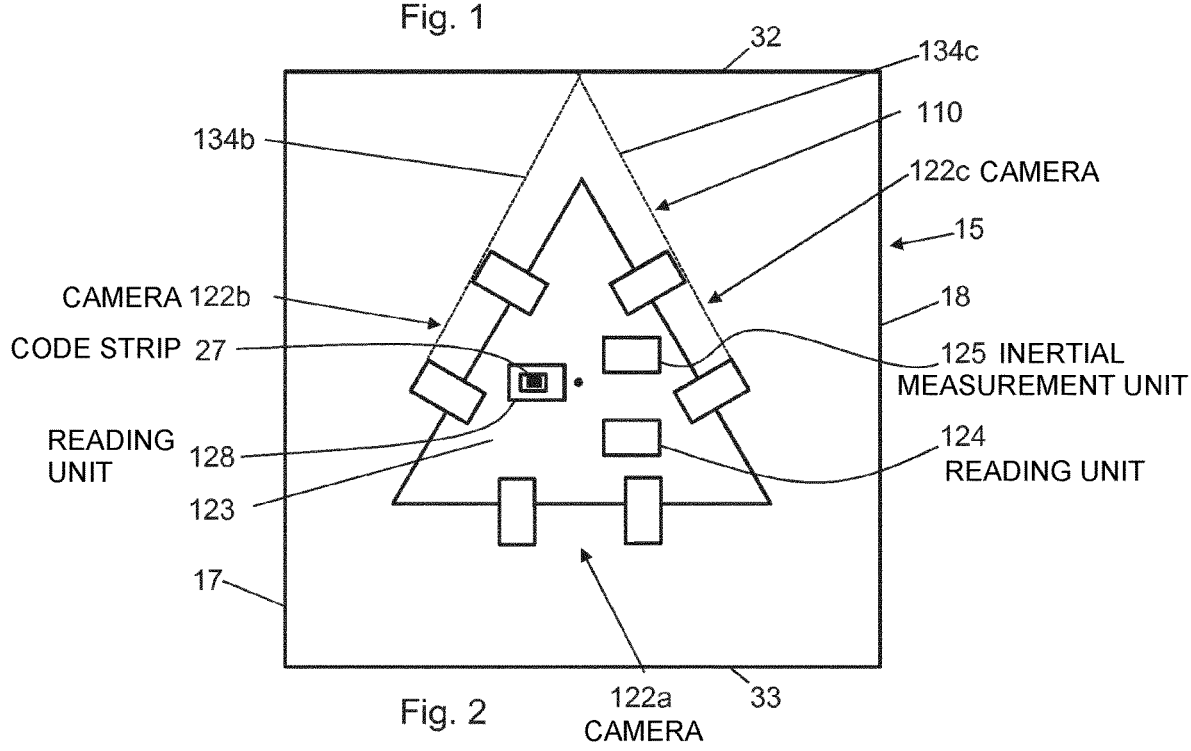
FIG. 2 shows a second embodiment of a measurement system according to the invention for surveying an elevator shaft.

FIG. 2 is a plan view (not to scale) of an alternative measurement system 110 to the measurement system 10 from FIG. 1 in an elevator shaft 15. Generally, the measurement system 110 has the same functionality as the measurement system 10 from FIG. 1, and so an elevator shaft is generally measured in the same manner. For these reasons, only the differences between the measurement systems will be discussed.

The measurement system 110 has a main body 123 having a cross section in the shape of an equilateral triangle. While the elevator shaft 15 is being measured, the measurement system 110 is oriented such that said cross section is transverse to, i.e. perpendicular to the main extension direction of the elevator shaft 15. In FIG. 2, the main extension direction of the elevator shaft 15 is oriented perpendicularly to the plane of the drawing.

On each side of the aforementioned equilateral triangle, a stereo camera 122a, 122b, 122c is arranged such as to face transversely to the main extension direction. The stereo cameras 122a, 122b, 122c are thus facing shaft walls 17, 18, 32, 33 of the elevator shaft 15. It is also possible for the stereo cameras to be arranged in a slightly tilted manner relative to the main extension direction, in particular toward the shaft pit.

Recording ranges of the stereo cameras 122a, 122b, 122c are designed such that each point of the elevator shaft 15, which is in more or less the same position in the main extension direction as the measurement system 110, can be recorded by a stereo camera 122a, 122b, 122c. An all-round view in relation to the main extension direction is thus ensured by the three stereo cameras 122a, 122b, 122c. The recording ranges of the three stereo cameras 122a, 122b, 122c overlap, although this is not strictly necessary. To illustrate this, FIG. 2 shows a boundary 134b of the recording range of the stereo camera 122b in the direction of stereo camera 122c, and a boundary 134c of the recording range of the stereo camera 122c in the direction of stereo camera 122b. As can be seen in FIG. 2, the boundaries 134b and 134c intersect while still within the elevator shaft 15, thus producing an overlap region between the recording ranges of the two stereo cameras 122b, 122c. Accordingly, overlap regions are produced between all the stereo cameras 122a, 122b, 122c.

The measurement system 110 additionally comprises a reading unit 128 for a code strip 27 of a position determination unit. In this case, the code strip 27 is guided through the reading unit 128, which is arranged behind the three stereo cameras 122a, 122b, 122c such that the reading unit 128 and the code strip 27 cannot be recorded by any of the three stereo cameras 122a, 122b, 122c. The reading unit 128 and the code strip 27 are thus not positioned within any of the recording ranges of the three stereo cameras 122a, 122b, 122c.

The measurement system 110 further comprises an evaluation unit 124 and an inertial measurement unit 125, which are also arranged such that they cannot be recorded by any of the three stereo cameras 122a, 122b, 122c.

Figure 3:
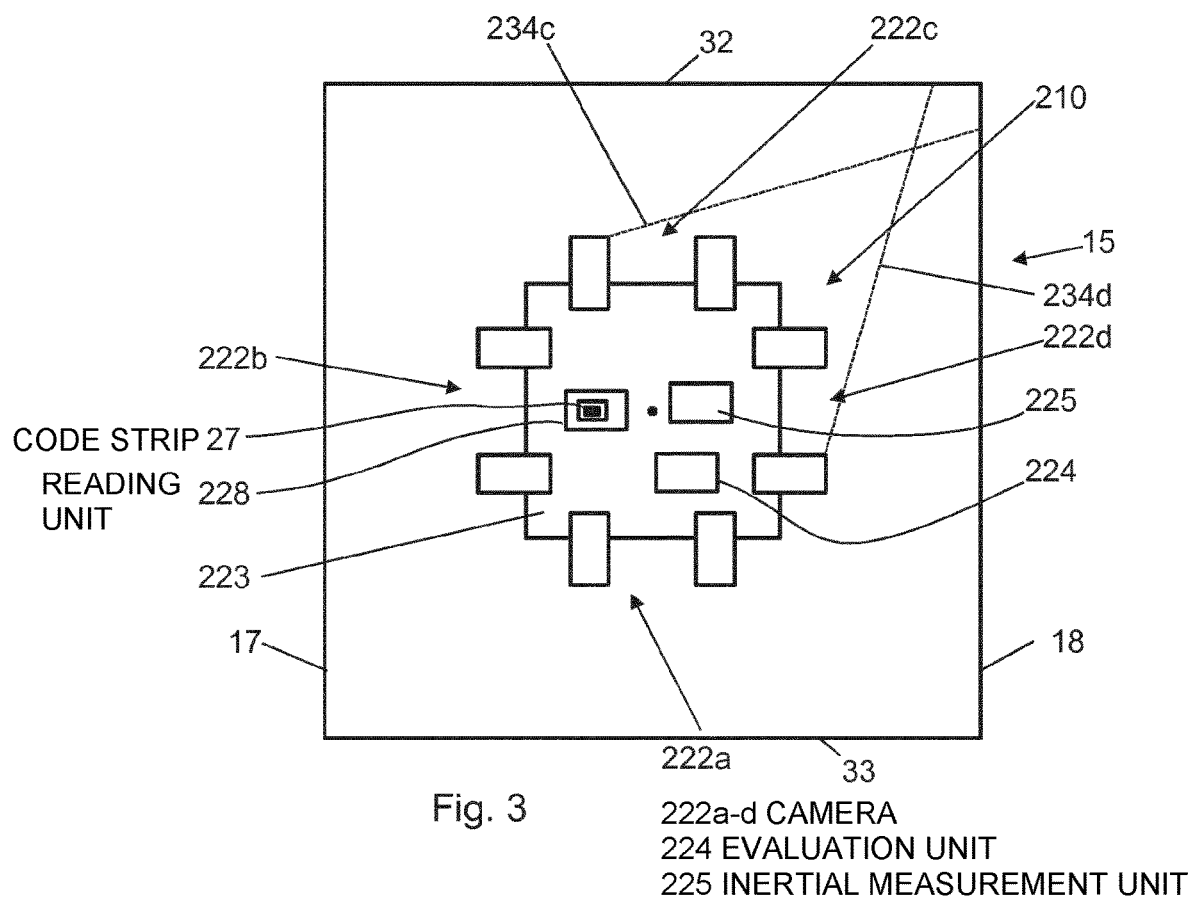
FIG. 3 shows a third embodiment of a measurement system according to the invention for surveying an elevator shaft.

FIG. 3 is a plan view (not to scale) of an alternative measurement system 210 to both the measurement system 10 from FIG. 1 and the measurement system 110 from FIG. 2 in an elevator shaft 15. The measurement system 210 has predominantly the same design as the measurement system 110 from FIG. 2, and so only the differences between the measurement systems will be discussed.

The measurement system 210 has a main body 223 having a cross section in the shape of a square. While the elevator shaft 15 is being surveyed, the measurement system 210 is oriented such that said cross section is transverse to, i.e. perpendicular to the main extension direction of the elevator shaft 15.

On each side of the aforementioned square, a stereo camera 222a, 222b, 222c, 222d is arranged such as to face transversely to the main extension direction. The stereo cameras 222a, 222b, 222c, 222d are thus directly facing shaft walls 17, 18, 32, 33 of the elevator shaft 15. It is also possible for the stereo cameras to be arranged in a slightly tilted manner relative to the main extension direction, in particular toward the shaft pit.

Recording ranges of the stereo cameras 222a, 222b, 222c, 222d are designed such that each point of the elevator shaft 15, which is in more or less the same position in the main extension direction as the measurement system 210, can be recorded by a stereo camera 222a, 222b, 222c, 222d. An all-round view in relation to the main extension direction is thus ensured by the four stereo cameras 222a, 222b, 222c, 222d. The recording ranges of the four stereo cameras 222a, 222b, 222c, 222d overlap, although this is not strictly necessary. To illustrate this, FIG. 3 shows a boundary 234c of the recording range of the stereo camera 222c in the direction of stereo camera 222d, and a boundary 234d of the recording range of the stereo camera 222d in the direction of stereo camera 222c. As can be seen in FIG. 3, the boundaries 234c and 234d intersect while still within the elevator shaft 15, thus producing an overlap region between the recording ranges of the two stereo cameras 222c, 222d. Accordingly, overlap regions are produced between all the stereo cameras 222a, 222b, 222c, 222d.

The measurement system 210 additionally comprises a reading unit 228 for a code strip 27, an evaluation unit 224, and an inertial measurement unit 225. The reading unit 228, the code strip 27, the evaluation unit 224, and the inertial measurement unit 225 are arranged such that they cannot be recorded by any of the four stereo cameras 222a, 222b, 222c, 222d.

Lastly, it should be noted that terms such as "having," "comprising" and the like do not preclude other elements or steps, and terms such as "a" or "one" do not preclude a plurality. Furthermore, it should be noted that features or steps that have been described with reference to one of the above embodiments may also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for analyzing an elevator shaft of an elevator system, the elevator shaft extending in a main extension direction, including surveying the elevator shaft with a measurement system having a camera system and creating a digital model of the elevator shaft on the basis of data determined during the survey, the method comprising the steps of:
   estimating a position of the measurement system in the elevator shaft using an inertial measurement unit of the measurement system having acceleration and angular-rate sensors; and
   recording and analyzing information representing the estimated position from the acceleration and angular rate sensors and further information on a position of the measurement system in the main extension direction to create the digital model of the elevator shaft.

2. The method according to claim 1 wherein the camera system of the measurement system includes at least three stereo cameras which, during the survey of the elevator shaft, are arranged transversely to the main extension direction to ensure an all-round view of the elevator shaft by the cameras.

3. The method according to claim 2 wherein the measurement system is coupled to a position determination unit that determines a position of the measurement system in the main extension direction, and providing the determined position as the further information on the position of the measurement system in the main extension direction.

4. The method according to claim 3 wherein the position determination unit determines the further information on the position of the measurement system in the main extension direction using an elongate positional information carrier oriented in the main extension direction, and the cameras and the positional information carrier are arranged relative to one another such that the positional information carrier is not recorded by any of the cameras.

5. The method according to claim 1 including arranging at least one reference element in the elevator shaft before performing the survey with the measurement system, and during the survey recording information on the at least one reference element with the measurement system as the further information on the position of the measurement system in the main extension direction.

6. The method according to claim 5 wherein the at least one reference element is arranged at a known position in the main extension direction in the elevator shaft and analyzing the known position to create the digital model of the elevator shaft.

7. The method according to claim 5 arranging another reference element in the elevator shaft at a known distance from the at least one reference element in the main extension direction and analyzing the known distance to create the digital model of the elevator shaft.

8. The method according to claim 1 including arranging an elongate orientation element extending in the main extension direction in the elevator shaft before performing the survey with the measurement system and during the survey using the elongate orientation element to verify the further information on the position of the measurement system.

9. The method according to claim 1 including after the digital model of the elevator shaft is created, comparing the digital model with a target model of the elevator shaft and generating a check of whether the elevator shaft meets specifications.

10. The method according to claim 1 including after the digital model of the elevator shaft is created, checking whether a planned design of the elevator system can be implemented in the surveyed elevator shaft.

11. The method according to claim 10 including wherein if the planned design of the elevator system cannot be implemented in the surveyed elevator shaft, making adjustments to at least one of the elevator shaft and the planned design of the elevator system.

12. A measurement system for surveying an elevator shaft of an elevator system, the elevator shaft extending in a main extension direction, including a camera system, comprising:
   an inertial measurement unit having acceleration and angular rate sensors for estimating a position of the measurement system in the elevator shaft; and
   an evaluation unit for recording and evaluating information representing the estimated position from the acceleration and angular rate sensors and further information on a position of the measurement system in the main extension direction to create a digital model of the elevator shaft.

13. The measurement system according to claim 12 including:
   at least three stereo cameras which, during the survey of the elevator shaft, are arranged transversely to the main extension direction to ensure an all-round view of the elevator shaft in relation to the main extension direction by the cameras; and
   a position determination unit having a reading unit for reading out information of a positional information carrier in the elevator shaft, the reading unit determining a position of the measurement system in the main extension direction as the further information.

14. The measurement system according to claim 13 wherein the reading unit and the cameras are arranged relative to one another such that the reading unit is not recorded by any of the cameras.

* * * * *